United States Patent [19]

Weisshaar et al.

[11] 3,885,243

[45] May 20, 1975

[54] SEMICONDUCTOR DEVICE

[75] Inventors: Erich Weisshaar; Dieter Spickenbreuther, both of Baden; Bernd Sitte, Magenwil, all of Switzerland

[73] Assignee: BBC Brown Boveri & Company Limited, Baden, Switzerland

[22] Filed: Sept. 24, 1973

[21] Appl. No.: 399,738

Related U.S. Application Data

[63] Continuation-in-part of Ser. No. 265,521, June 23, 1972, abandoned.

[30] Foreign Application Priority Data

June 25, 1971 Switzerland ........................ 9331/71

[52] U.S. Cl. ...................... 357/79; 357/13; 357/72; 357/74; 357/76; 357/80; 357/90

[51] Int. Cl. ........................... H01l 3/00; H01l 5/00

[58] Field of Search...317/234, 1, 3, 4, 6, 11, 235, 317/30, 48.1

[56] References Cited

UNITED STATES PATENTS

| | | | |
|---|---|---|---|
| 3,263,092 | 7/1966 | Knauss | 317/234 T |
| 3,299,487 | 1/1967 | Cook et al. | 317/235 T |
| 3,351,828 | 11/1967 | Beale et al. | 317/235 |
| 3,396,316 | 8/1968 | Wislocky | 317/234 |
| 3,447,118 | 5/1969 | Ferree | 317/234 P |
| 3,597,524 | 8/1971 | Schreiner | 317/234 E |
| 3,644,801 | 2/1972 | Sheldon | 317/235 R |
| 3,654,529 | 4/1972 | Lord | 317/234 P |
| 3,664,894 | 5/1972 | Einthoven et al. | 317/235 |

FOREIGN PATENTS OR APPLICATIONS

| | | | |
|---|---|---|---|
| 1,017,336 | 1/1966 | United Kingdom | 317/234 P |

*Primary Examiner*—Andrew J. James
*Attorney, Agent, or Firm*—Oblon, Fisher, Spivak, McClelland & Maier

[57] ABSTRACT

Two or more semiconductor device connected in series opposition and contacted by pressure contacts are enclosed in a common housing to form a surge diverter. The two diodes connected in series opposition are formed from a single semiconductor wafer exhibiting three layers whose conductivity types alternate from one to the next. The end faces of the semiconductor wafers have an edge concentration of at least $10^{19}$ atoms/cm$^3$, preferable $5 \cdot 10^{20}$ atoms/cm$^3$. The doping gradient is chosen so that the charge carrier concentration at a depth of 35 microns is still $10^{16}$ atoms/cm$^3$. Different embodiments of the semiconductor device and housing structure are also disclosed.

15 Claims, 4 Drawing Figures

SEMICONDUCTOR DEVICE

CROSS-REFERENCE TO RELATED APPLICATION

This application is a continuation-in-part of application Ser. No. 265,521, filed June 23, 1972, now abandoned.

BACKGROUND OF THE INVENTION

1. Field of the Invention

This invention relates to semiconductor devices, and particularly to surge diverters or voltage limiters using at least two semiconductor diodes connected in series opposition, contacted by pressure contacts and enclosed in a housing.

2. Description of the Prior Art

Power thyristors are of great importance today, for example, in inverter stations for high-voltage direct current (hvdc) transmission systems, power plants for broadcast transmitters, railway power supply, generator excitation equipment, high voltage drive control systems, and the like.

To handle the extremely high voltages, which may be more than 100 kV for example, a great number of thyristors, e.g., 200, may be stacked in series in a column, thus forming a thyristor valve.

In order to avoid electrical breakdown of such thyristors due to a surge voltage, in the past it was necessary to provide great safety margins for each thyristor, resulting in high production costs. Moreover, because of certain physical properties of a thyristor, RC-networks of great expense were also necessary.

In order to avoid these difficulties and to reduce the production costs of such thyristors while simultaneously improving the efficiency of their operation, the use of semiconductor surge diverters has been proposed.

Semiconductor devices of this kind have been employed in static converter systems as protection against over-voltages. A known semiconductor device, described in Swiss Pat. No. 465,064, employs several semiconductor diodes connected in series opposition. The diodes, each provided with contact disks, are placed in series with spring elements between them and are enclosed in a common housing. Such a device is mechanically elaborate and requires the use of matched diodes if the final product is to exhibit the same electrical properties, e.g., avalanche voltage, in both directions of current flow. A further drawback of such a device becomes apparent during the manufacture of the individual diodes. Because a number of the processes for manufacturing the individual diodes generally involve the application of heat, the electrical characteristics of the diodes and in particular their current-voltage characteristic in the reverse direction, may be undesirably modified.

A need therefore exists for an improved semiconductor device suitable for use as a voltage limiter or surge diverter for high voltage, high power thyristors and other active circuit elements.

SUMMARY OF THE INVENTION

Accordingly, one object of this invention is to provide a semiconductor device, and in particular a surge diverter, which avoids the drawbacks of known devices.

Another object of this invention is to provide a semiconductor device which is simple and easy to manufacture, but which nevertheless exhibits good electrical properties.

Yet another object of this invention is the provision of a novel housing for a semiconductor voltage limiter.

A still further object of this invention is the provision of a semiconductor voltage limiter and a novel housing therefor, wherein both said voltage limiter and said housing are particularly suited for efficient and economical manufacture.

Another object of this invention is to provide a semiconductor voltage limiter which does not require metalization of the active surfaces of the semiconductor or soldered contacts.

Briefly, in semiconductor devices of the type described above, such objects are achieved, according to the present invention, by forming the two diodes connected in series opposition from a single semiconductor wafer having three layers whose conductivity types alternate from one to the next. The end faces of the semiconductor wafer are doped so as to obtain an edge concentration of at least $10^{19}$ atoms/cm$^3$, and preferably 5 $\cdot 10^{20}$ atoms/cm$^3$. The doping gradient is chosen so that the charge carrier concentration still amounts to at least $10^{16}$ atoms/cm$^3$ at a depth of 35 microns. The thickness of the inner layer is preferably greater than 1.5 times the known optimal thickness $w$ for thyristors, end is preferably $2w$.

By virtue of these features, the semiconductor wafers exhibit good volumetric conductivity at the end faces. Thus, it is unnecessary to apply metallized finishes to the end faces; the application of such metallized finishes, e.g., the application of a nickel or gold layer, or both, has hitherto been considered essential. In particular, the features obviate the need to provide alloyed-on carrier plates for either one or both end faces. In addition to other undesirable properties, both metallizing and alloying-on of carrier plates give rise to changes in the current-voltage characteristics of the active section. Thus, these features avoid jeopardizing the viability of the system as a surge diverter.

According to another feature of the invention, intermediate layers, preferably of silver 0.05mm thick are provided between the semiconductor wafer and the pressure contact elements. Preferably these intermediate layers have a dished or disk form with the internal faces of these intermediate layers being disposed towards the pressure contact elements.

The above features improve the breakdown resistance of the device by increasing the leakage path between the two pressure contact elements responsible for supplying the current.

According to another feature of the invention, the space between the intermediate layers is filled with an elastic, electrically insulating, adhesive material such as silicone rubber. The latter exhibits good adhesion, is elastic and is a good electrical insulator. This material serves not only to protect the high sensitive edge zone but simultaneously to fix the semiconductor wafer during assembly and storage.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
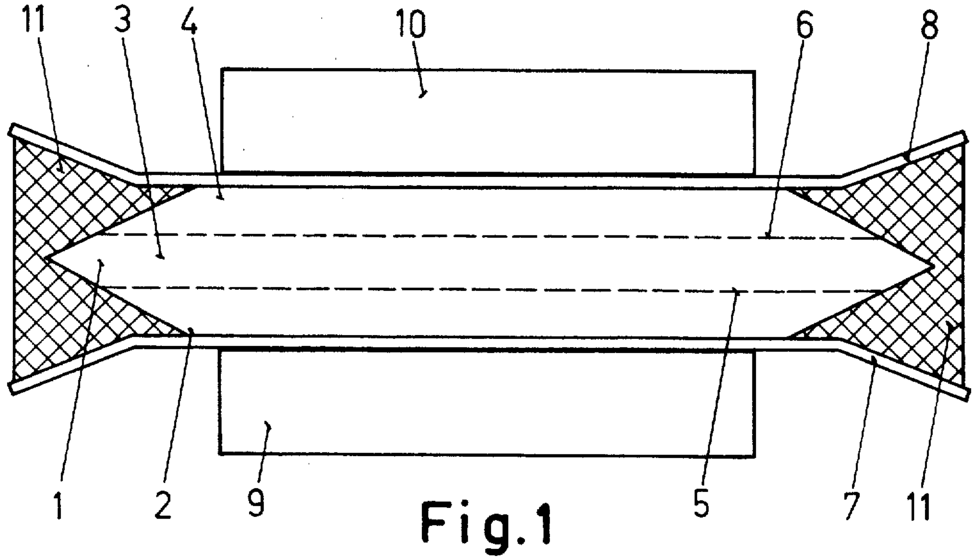
FIG. 1 illustrates a first embodiment of a semiconductor device including features of the present invention.

Referring now to the drawings, wherein like reference numerals designate identical or corresponding parts throughout the several views, and more particularly to FIG. 1 thereof, a germanium or silicon semiconductor wafer 1 is illustrated having three layers whose conductivity types alternate from one to the next. The wafer is formed of an n-type layer 2, a p-type layer 3, and an n-type layer 4. The layers in turn form p-n-junctions 5 and 6 indicated by simple broken lines. The edge of the wafer 1 is bevelled on both sides in the usual manner in order to increase the breakdown resistance.

Contacting the respective faces of the semiconductor wafer 1 are two dish-shaped intermediate inserts 7 and 8. The external bases of the inserts 7 and 8 are disposed towards the faces of the semiconductor wafer 1. The inserts are composed of a ductile material, preferably silver, and are at least 0.05mm thick. Their external diameter exceeds that of the active section 1.

A synthetic material 11 which has good adhesion, is elastic, and is a good electrical insulator fills the space between the inserts 7 and 8. Synthetic materials of this kind which are designed especially for semiconductor applications, are well known. Such materials are available as junction coating resin R 90 710 and junction coating resin R 60 093 from the Dow Corning Company. The material protects the p-n-junctions which appear at the surface of the semiconductor wafer 1. The material also attaches the two inserts 7 and 8 to the semiconductor wafer. In this fashion, an active section which is protected against damage during storage and assembly, is obtained.

Metal disks 9 and 10 which serve as pressure contact elements contact the inserts 7 and 8. The metal disks 9 and 10 exert symmetrical pressure on the semiconductor wafer 1. For this purpose the diameters of the two disks are identical.

The disks 9 and 10, according to one embodiment of the invention, are composed of molybdenum, tungsten or tantalum. According to a more preferred embodiment of the invention, the disks 9 and 10 are made of metal or alloys which have good thermal and electrical conductivity. For example, according to an embodiment of this invention, the disks 9 and 10 are made of hard copper or copper alloys with high mechanical strength. The materials of the disks 9 and 10 are chosen so as not to create any bond, under pressure or thermal loading or both, with that of the inserts 7 and 8. The latter inserts serve as electrodes. According to an embodiment of the invention, the end faces of the metal disks which are disposed towards the inserts or electrodes 7 and 8 are provided with a layer of nickel to prevent such bonding. Other materials similar to nickel may also be used according to another embodiment of the invention.

Diameters of the metal disks 9 and 10 are not substantially less than the diameters of the bases of the dished inserts 7 and 8. This allows fixing of the radial position of the metal disks 9 and 10 in relation to the active section which is provided with the inserts 7 and 9.

The semiconductor wafer 1 and the attached inserts 7 and 8, as well as the two metal disks, are placed in a suitable pressure contact housing and clamped in position. The housing is a conventional pressure contact housing and is not illustrated. Such a housing can, in well known manner, be produced to serve as a cooling element or can be installed in its own cooling device.

According to an embodiment of the invention, the active section is manufactured from a monocrystalline n-doped silicon wafer. A p-conductive zone extending over the entire area of the silicon wafer is produced by diffusing a suitable doping substance such as boron into the wafer. Identical charge carrier concentrations are achieved at both end faces of the silicon wafer by using so-called ampoule diffusion.

Using this type of diffusion technique, as those skilled in the art will appreciate, the silicon wafers which are to be processed are placed into a vessel, the ampoule, without contact between the individual wafers. Subsequently, the vessel is hermetically sealed and placed in a diffusion furnace. The quantity and nature of the doping substance as well as the other reaction parameters are chosen so that the wafer produced exhibits an edge concentration of at least $10^{19}$ and preferably $5 \cdot {}^{1020}$ atoms/$cm^3$ and a doping gradient which is such that the charge carrier concentration at a depth of 35 $\mu$ is still greater than $10^{16}$ atoms/$cm^3$. In other words, this means that the surface zone at the two end faces of the silicon wafer exhibit a good volumetric conductivity. The reasons for this concentration will be explained. After completion of diffusion, the p-doped zone at the edge of the silicon wafer is removed and the thus treated edge bevelled on both sides in the normal way. After bevelling the silicon is etched in order to remove impurities and dislocated crystal zones at the surface.

Other characteristics of the semiconductor wafer of the present invention include the doping concentration in the inner layer less than $10^{17}$ atoms/$cm^3$, preferably less than $10^{16}$ atoms/$cm^3$; the thickness of outer layers less than 100 $\mu$m; the thickness $d$ of inner layer greater than 1.5 times that thickness $w$ (or width) which is known as optimal for a thyristor. That is, the width $w_n$ of the space charge layer at the highest blocking voltage plus two times the diffusion length $L_p$ of the minority carriers, whereby $$w_n = \Sigma/e \cdot E_{crit} \cdot 1/N_{D+},$$

where $\Sigma$ is the dielectric constant of Si (11.8 $\Sigma_o$), $e$ is the electronic charge ($1.602 \times 10^{-19}$ AS), $E_{crit}$ is the critical field strength in Si ($1.9 \times 10^5 - 2.5 \times 10^5$ V/cm in Si), $N_{D+}$ is the density of ionized donors (atoms/$cm^{-3}$), and $L_p = \quad D_p\tau_p$ with $D_p$ being the diffusion constant for holes ($cm^2\ s^{-1}$) and $\tau_p$ carrier life of holes ($s$).

At a further stage of the process, the silicon wafer is placed between two inserts, centered and temporarily clamped by means of a suitable fixture. Thereafter, the space between the two inserts is filled with the aforementioned synthetic material. After this synthetic material has hardened, the active section can be removed from the temporary fixture and assembled in its final location.

Figure 2:
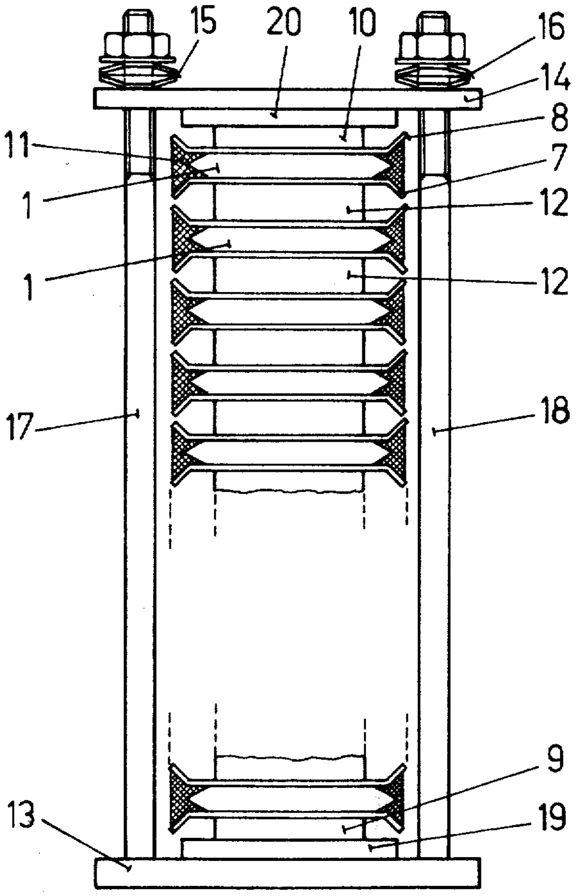
FIG. 2 illustrates an example of a cascade arrangement utilizing a plurality of devices of the kind shown in FIG. 1.

Unlike conventional techniques, contacting according to the embodiments of the present invention is effected without producing any bonded connections between the semiconductor wafer and the adjoining parts. The semiconductor wafer is slidably clamped between the pressure contact elements and the adjoining assembly devices. This allows for uncommonly simple and economic manufacture. FIG. 1 illustrates only one semiconductor device. According to an embodiment of the invention, several semiconductor wafers contacted in accordance with the invention, i.e., provided with inserts, are arranged in series. This is illustrated in FIG. 2. A cascade of surge voltage diverters of this kind are excellently suited for static converter systems of the kind used for high-voltage work, such as for high-voltage direct current transmission or railway installations.

In FIG. 2, metal connecting electrodes 12 connect the active sections in cascade. Two metal disks 9 and 10 at the end of the cascaded active sections also serve as connecting electrodes. A clamping frame with pressure plates 13 and 14 and force storers 15 and 16, e.g., spring washers, together with bolts 17 and 18 effect pressure-contacting. The clamping frame is insulated from the active section by two insulating disks 19 and 20.

In FIGS. 1 and 2, each wafer forms two diodes by virtue of its junctions. The diodes are in opposing series relationship which exhibit virtually the same electrical properties, such as avalanche voltage, in both directions of current flow. The manufacture of such diodes is comparatively simple. Because the manufacturing process does not involve the application of heat to the diodes after they are formed, the electrical characteristics of the diodes, and in particular their current-voltage characteristic in the reverse direction is not undesirably modified.

The structure according to the invention requires no metallized finishes or alloyed-on carrier plates. According to an embodiment of the invention, the material 11 can be any suitable silicone rubber.

According to another embodiment of the invention, the wafer is manufactured from germanium.

The concentration previously mentioned provides the good volumetric conductivity which is so important in this environment. In this regard, it should be noted that connecting the electrodes 12 which connect the active sections in cascade in FIG. 2 serve as pressure contact elements.

Figure 3:
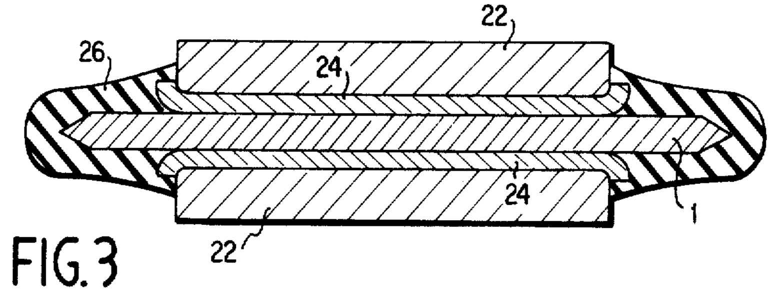
FIG. 3 illustrates a second embodiment of a semiconductor device including the features of the present invention; and, FIG. 4 is a cut-away view of a housing for use with the semiconductor device illustrated in FIG. 3.

Referring now to FIG. 3, a second embodiment of a semiconductor device according to the present invention is shown. The device illustrated in FIG. 3 is similar to that shown in FIG. 1, but includes several structural modifications which render it more suitable for manufacturing and commercial use. The semiconductor wafer 1 is substantially the same as that illustrated in FIG. 1 and includes all of the properties enumerated above. More particularly, the semiconductor wafer 1 is preferably a silicon tablet wherein the outer p-type layers are made by boron and aluminum diffusion. Since aluminum has a greater diffusion constant than boron, it is responsible for the doping near the pn-junction, whereas the boron is responsible for the end surface doping. The end surface doping concentration is preferably $10^{20}$ atoms/cm$^3$ (p-type), while the middle doping is preferably between $10^{14}$ and $10^{15}$ atoms/cm$^3$.

A pair of pressure contacts 22 are positioned on opposite sides of the wafer 1, and are electrically connected to the wafer 1 by means of a pair of silver dish elements 24. The disk shaped pressure contacts 22 are preferably formed of molybedenum, although other equivalent metals, noted above, may also be used. The silver dish elements 22 are preferably quite thin and are formed to interfit closely with the portions of the pressure contacts 22 which abut the semiconductor wafer 1.

A protective ring of resin 26 surrounds the junction area where the semiconductor wafer 1, the pressure contacts 22 and the silver dish elements 24 meet. The protective resin layer is preferably formed of Dow Corning junction coating resin R 60-093.

The structure of the semiconductor device illustrated in FIG. 3 differs from that illustrated in FIG. 1 in that the silver dish elements 24 in FIG. 3 closely interfit with the pressure contacts 22, while in the embodiments of FIG. 1 the dish-shaped intermediate inserts 7 and 8, which correspond to the silver dish elements 24, extend outwardly from the contact elements 9 and 10 and also extend beyond the active region of the semiconductor wafer 1. The shape of the dish elements illustrated in FIG. 3 is more convenient for manufacturing purposes, and does not adversely affect the operation of the semiconductor device. The dish elements 24 may otherwise, however, be constructed and treated in the same manner as the dish-shaped intermediate inserts 7 and 8 of FIG. 1. The shape of the resin ring 26 illustrated in FIG. 3 also differs from that of FIG. 1 in that the ring in FIG. 3 has an abitrary cross-sectional configuration. The resin ring 26 of FIG. 3 represents a more natural configuration than that illustrated in FIG. 1 for the material 11, and is thus easier to manufacture, although it provides the same bonding and protective functions as the more symmetrical synthetic material layer 11 shown in FIG. 1. The structure illustrated in FIG. 3 is equivalent to that of FIG. 1 in that the various elements are coupled together through a pressure contact, and are not bonded together except for the effect of the resin ring 26.

Figure 4:
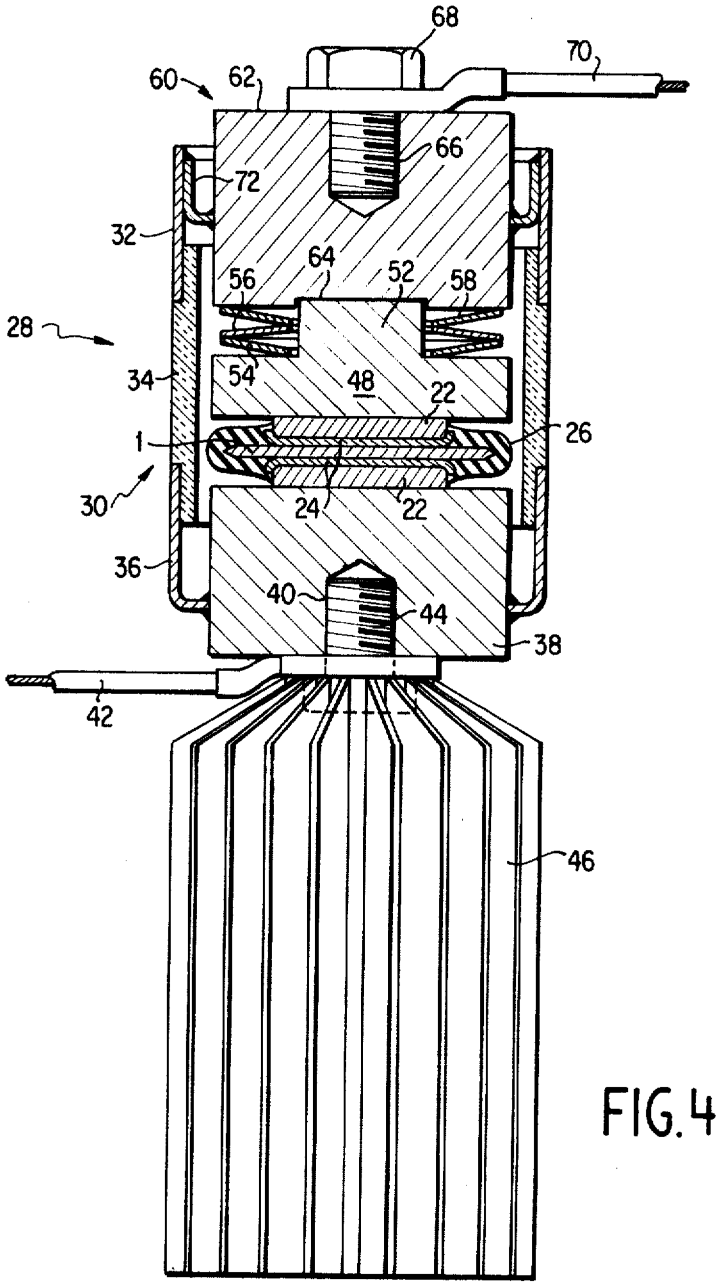

Referring now to FIG. 4, a housing structure 28 is shown for providing a means of mounting and utilizing the semiconductor device illustrated in FIG. 3. The housing structure 28 includes a cylindrical wall structure 30 comprised of an upper metal ring element 32, a central ceramic sleeve 34 and a lower metal ring element 36. The metal ring elements are preferably formed of a suitable alloy such as kovar, and are rigidly integrated together with the central ceramic sleeve to form a structurally solid and fluid tight housing. The central ceramic sleeve 34 provides the insulation necessary to electrically isolate the active elements within the housing 28 from the metal portions of the housing wall. A disk shaped bottom block 38, preferably formed of copper, is inductively welded to the lower metal ring element 36. The copper bottom block 38 includes a threaded aperture 40 to permit an electrical lead 42 to be coupled to the housing 28 by means of a bolt 44. The bolt 44 may also be used to secure a cooling body 46 to the housing 28 to facilitate heat dissipation.

The entire semiconductor element as illustrated in FIG. 3 is inserted into the housing 28 so that one of the pressure contacts 22 rests upon the interior surface of the bottom block 38. This assembly step is especially easy according to the present invention, since there is no bonding between the bottom block and the appropriate pressure contact 22. Thus, the assembled semiconductor device shown in FIG. 3 may be simply dropped into proper position within the housing 28.

An intermediate contact element 48, preferably constructed of copper and including a lower disk portion 50 and an upwardly extending neck portion 52, is subsequently inserted into the housing 28 such that the lower disk portion 50 engages the upwardly directed pressure contact 22. First, second and third spring washers 54, 56 and 58, respectively, are placed over the neck portion 52 of the intermediate contact element 48. Each of the spring washers consists of an annular element of a resilient metal having a slightly dished shape. The three spring washers are placed on the neck portion 52 such that the dished sides of the individual spring washers alternately face in opposite directions. Thus the resiliency of the individual spring washers are additively combined.

Finally, a cover assembly 60 is inserted into the open upper portion of housing structure 28 to fully enclose the housing structure. The cover assembly 60 includes a central copper disk contact 62 having a cylindrical recess 64 in the lower surface thereof and a threaded aperture 66 in the upper surface thereof. The cylindrical recess 64 is adapted to receive the upper end of neck portion 52 when the housing is finally assembled. The threaded aperture 66 is adapted to receive a bolt 68 for securing an electrical lead 70 to the copper disk contact 62. A cooling body (not shown) similar to that illustrated at 46 may also be coupled to the copper disk contact 62 by bolt 68. A sealing ring 72, which is preferably formed of the same metal as the upper ring element 32, is welded to the disk contact 62 to complete the cover assembly 60. The sealing ring 72 has an outer conforms which confroms closely to the inner diameter of the upper metal ring element 32 so that the cover assembly 60 closely interfits with the element 32 to enclose the housing structure 28.

The housing structure and all of the parts contained in it are initially assembled simply by dropping the parts in place in the proper sequence, and finally placing the cover assembly 60 in place. There is no need to weld or bond the interior elements together in any way since all elements are interconnected simply by a pressure contact. Once the cover assembly is in place, pressure is applied to it to exert force on the spring washers 54 through 58, and to consequently ensure a firm and positive electrical contact between all elements within the housing 28. The cover assembly is then inductively welded to the housing structure 28 while pressure is applied to the cover assembly, thereby completing the structure.

In operation, one of the two pn-junctions in the semiconductor device is always in the reverse blocking condition. Thus the device does not influence a thyristor coupled in parallel with it, as long as the voltage across the two elements does not exceed the breakover voltage of the junction which is in the blocking condition. However, if a surge voltage exceeding the breakover voltage occurs, then an avalanche current is caused inside the surge diverter of the present invention, reducing the voltage across the device to nearly zero, and thus protecting the thyristor. The avalanche current does not damage the semiconductor element since it occurs only inside the volume of the semiconductor body and is dissipated homogeneously over the pn-junction area. An even distribution of the current over the pn-junction area is achieved due to the bevelled edge surfaces and the dopping requirements described above. Thus these features ensure that a sufficient number of carriers are present at the highly doped end surfaces of the semiconductor element so that the avalanche current occurs inside the volume of the element rather than along its surface. The lack of metallized end surfaces between the semiconductor material and the pressure contacts causes no ill effect, but merely results in a slight voltage drop which is neglegible in relation to the blocking voltage, since the blocking voltage may be between 500 to 800 volts, and preferably higher.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A semiconductor device comprising:

a pair of semiconductor diodes connected in series opposition, said diodes formed in a single monocrystalline silicon semiconductor wafer having three layers of alternating conductivity types including an inner layer and a pair of outer layers, said semiconductor wafer bevelled around its periphery on both sides thereof, and having non-metalized end surfaces, wherein said end surfaces of said semiconductor wafer have an edge doping concentration of at least $10^{19}$ atoms/cm$^3$, said wafer has a doping gradient at its end surfaces such that the doping concentration at a depth of 35 microns is greater than $10^{16}$ atoms/cm$^3$, the doping concentration of said inner layer is less than $10^{17}$ atoms/cm$^3$, preferably less than $10^{16}$ atoms/cm$^3$, and the thickness of said outer layers of said semiconductor device is less than 100 microns;

a pressure contact structure juxtaposed to each face of said semiconductor wafer, each pressure contact structure including a thin, dish-shaped element of a highly ductile and highly conductive metal one side of which engages one of said non-metalized end surfaces of said semiconductor wafer, and a thicker, disk-shaped conductive element abutting the exposed side of each dish-shaped element; and, a band of flexible insulative material surrounding the periphery of said semiconductor wafer, said insulative material adhering said thin, dish-shaped elements to said semiconductor wafer.

2. A semiconductor device as in claim 1, wherein the end faces of the semiconductor wafer have an edge concentration equal substantially to $5 \cdot 10^{20}$ atoms/cm$^3$.

3. A device as in claim 1, wherein the end faces of the semiconductor wafer have an edge concentration of between $10^{19}$ atoms/cm$^3$ and $5 \cdot 10^{20}$ atoms/cm$^3$.

4. A device as in claim 1, wherein said pressure contact elements have end faces disposed toward the semiconductor wafer and in pressure contact therewith, said pressure contact element having the same geometric form and bearing symmetrically against said semiconductor wafer.

5. A device as in claim 1, wherein the inner layer of said semiconductor wafer at least 1.5 times the optimal thickness for thyristors.

6. A device as in claim 1, wherein said flexible insulative material is composed of silicone rubber.

7. A semiconductor voltage limiter device comprising:

a pair of semiconductor diodes connected in series opposition, said diodes formed in a single semiconductor wafer having three layers of alternating conductivity types including an inner layer and a pair of outer layers, bevelled edges on both sides thereof and no metalization on the active surfaces thereof, wherein the end faces of said semiconductor wafer have an edge doping concentration of at least $10^{19}$ atoms/cm$^3$, said wafer has a doping gradient at its end surfaces such that the doping concentration at a depth of 35 microns is greater than $10^{16}$ atoms/cm$^3$, the doping concentration of said inner layer is less than $10^{17}$ atoms/cm$^3$, preferably less than $10^{16}$ atoms/cm$^3$, and said outer layers of said semiconductor wafer are less than 100 microns thick;

solderless pressure contact assemblies engaging said non-metalized active surfaces of said semiconductor wafer, a housing for said semiconductor wafer and said solderless pressure contact assemblies; and, spring means engaging said housing for biasing said pressure contact assemblies into firm engagement with said semiconductor wafers, said housing applying a compressive force to said spring means.

8. A device as in claim 7, wherein said solderless pressure contact assemblies each include:

thin dish-shaped elements formed of highly conductive and ductile metal, said dish-shaped elements directly contacting said semiconductor wafer; and, thicker disk-shaped conductive elements engaging the exposed dished surfaces of said dish-shaped elements.

9. A device as in claim 7, wherein said housing comprises:

a bottom contact fixed to said housing for engaging one of said pressure contacts, a movable intermediate contact contained within said housing for engaging the other one of said pressure contacts; and, a cover assembly for sealing said housing and for applying pressure to said contacts contained within said housing.

10. A device as in claim 7, wherein:

one of said solderless pressure contact assemblies includes a bottom portion of said housing.

11. A device as in claim 10, further comprising:

a cooling assembly secured to said bottom portion of said housing for dissipating heat generated within said housing.

12. A device as in claim 7, wherein:

one of said solderless pressure contact assemblies includes a disk-shaped conductive body, one surface of which engages said semiconductor wafer;

a reduced neck portion formed integral with another surface of said disk-shaped conductive body; and, wherein said spring means includes at least one spring washer positioned about said reduced neck portion.

13. A device as in claim 12, wherein:

said housing includes a top portion for enclosing one end of said housing and for engaging and applying compressive pressure to said spring washer.

14. A device as in claim 7, wherein each of said solderless pressure contact assemblies includes a thin, dish-shaped element of a highly ductile and highly conductive metal one side of which engages said semiconductor wafer;

a first disk-shaped conductive element abutting the exposed side of said dish-shaped element; and, a second disk-shaped conductive element abutting said first disk-shaped conductive element.

15. A device as in claim 7, wherein:

said housing includes a ceramic sleeve, a pair of alloy ring elements rigidly secured to opposite ends of said ceramic sleeve; and, conductive top and bottom portions secured to said alloy ring elements for sealing said housing in a fluid tight manner.

* * * * *